(12) United States Patent
Bussa et al.

(10) Patent No.: US 9,713,270 B2
(45) Date of Patent: Jul. 18, 2017

(54) VOLTAGE REGULATING DEVICE

(75) Inventors: Marco Bussa, Viarigi (IT); Giovanni Delsant, Ferrere (IT)

(73) Assignee: GATE S.R.L., Turin (IT)

( * ) Notice: Subject to any disclaimer, the term of this patent is extended or adjusted under 35 U.S.C. 154(b) by 0 days.

(21) Appl. No.: 13/357,970

(22) Filed: Jan. 25, 2012

(65) Prior Publication Data
US 2012/0187888 A1 Jul. 26, 2012

(30) Foreign Application Priority Data

Jan. 25, 2011 (IT) .............. TO2011A0059

(51) Int. Cl.
| | |
|---|---|
| H02P 29/00 | (2016.01) |
| H05K 5/00 | (2006.01) |
| H02K 5/22 | (2006.01) |
| H02K 15/00 | (2006.01) |
| H02K 11/33 | (2016.01) |
| H05K 7/10 | (2006.01) |
| G05D 23/22 | (2006.01) |

(52) U.S. Cl.
CPC ........... *H05K 5/0069* (2013.01); *H02K 5/225* (2013.01); *H02K 11/33* (2016.01); *H02K 15/0006* (2013.01)

(58) Field of Classification Search
USPC ...................................... 318/504
See application file for complete search history.

(56) References Cited

U.S. PATENT DOCUMENTS

| | | | | |
|---|---|---|---|---|
| 4,425,766 | A * | 1/1984 | Claypole | 62/133 |
| 4,523,564 | A * | 6/1985 | Sturdy | 123/361 |
| 4,744,022 | A * | 5/1988 | Kumar et al. | 700/13 |
| 4,780,631 | A * | 10/1988 | Groninger | 310/71 |
| 5,038,088 | A * | 8/1991 | Arends et al. | 318/565 |
| 5,181,852 | A * | 1/1993 | Dambach et al. | 439/52 |
| 5,325,267 | A * | 6/1994 | Ewing | 361/760 |
| 5,515,217 | A * | 5/1996 | Higashikata | H02K 11/25 361/103 |
| 5,764,010 | A * | 6/1998 | Maue et al. | 318/443 |
| 6,111,378 | A * | 8/2000 | LeMay | B60R 16/0315 15/250.17 |
| 6,356,044 | B1 * | 3/2002 | Archer | 318/538 |
| 6,369,536 | B2 * | 4/2002 | Beifus et al. | 318/400.12 |
| 6,379,164 | B1 * | 4/2002 | Cash, Jr. | H02G 3/00 439/106 |
| 6,838,852 | B1 * | 1/2005 | Namuduri | 318/565 |
| 2001/0048279 | A1 * | 12/2001 | Beifus et al. | 318/254 |
| 2003/0213087 | A1 * | 11/2003 | Moein et al. | 15/250.3 |
| 2004/0244135 | A1 * | 12/2004 | Holbrook et al. | 15/250.27 |

(Continued)

FOREIGN PATENT DOCUMENTS

| | | |
|---|---|---|
| CN | 1306690 | 8/2001 |
| CN | 201396302 | 2/2010 |
| EP | 1040966 | 10/2000 |

*Primary Examiner* — Eduardo Colon Santana
*Assistant Examiner* — Said Bouziane
(74) *Attorney, Agent, or Firm* — Muncy, Geissler, Olds & Lowe, P.C.

(57) ABSTRACT

A voltage regulating device for an electric motor has programmable control and regulation circuits carried by a circuit board mounted in a sealed support casing. The circuits have at least one programming terminal which is accessible from outside the support casing to enable programming of the circuits without opening the support casing.

8 Claims, 4 Drawing Sheets

(56) References Cited

U.S. PATENT DOCUMENTS

| | | | |
|---|---|---|---|
| 2004/0244136 A1* | 12/2004 | Bledsoe et al. | 15/250.27 |
| 2005/0068750 A1 | 3/2005 | Origlia | |
| 2006/0021176 A1* | 2/2006 | Moein et al. | 15/250.3 |
| 2007/0097566 A1* | 5/2007 | Woods et al. | 361/33 |
| 2007/0282551 A1* | 12/2007 | Harmer et al. | 702/94 |
| 2008/0284364 A1* | 11/2008 | Schmid | 318/452 |
| 2009/0061546 A1* | 3/2009 | Labitzke et al. | 438/17 |
| 2009/0082908 A1* | 3/2009 | Green | 700/276 |
| 2009/0224703 A1* | 9/2009 | Woods et al. | 318/17 |
| 2009/0284877 A1* | 11/2009 | Heravi et al. | 361/31 |
| 2010/0271797 A1* | 10/2010 | Schurz | F01P 7/048 361/820 |
| 2011/0286185 A1* | 11/2011 | Abe et al. | 361/710 |
| 2012/0161590 A1* | 6/2012 | Yamasaki et al. | 310/68 B |
| 2012/0227928 A1* | 9/2012 | Green | 165/11.1 |
| 2012/0286605 A1* | 11/2012 | Miyachi et al. | 310/71 |
| 2013/0099611 A1* | 4/2013 | Suga et al. | 310/71 |
| 2013/0120107 A1* | 5/2013 | Song et al. | 340/4.3 |
| 2013/0257193 A1* | 10/2013 | Toda et al. | 310/52 |

\* cited by examiner

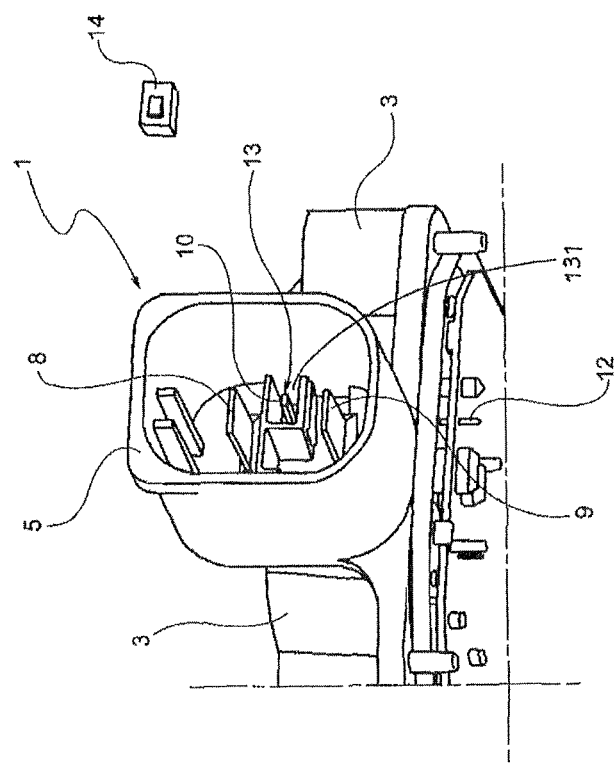
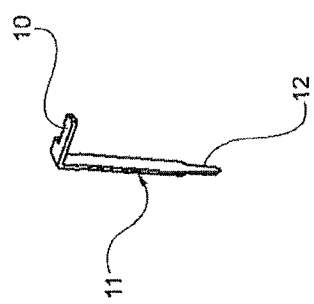
FIG. 2
FIG. 2a

VOLTAGE REGULATING DEVICE

CROSS REFERENCE TO RELATED APPLICATIONS

This non-provisional patent application claims priority under 35 U.S.C. §119(a) from Patent Application No. TO 2011 A 000059 filed in Italy on Jan. 25, 2011.

FIELD OF THE INVENTION

The present invention relates to a voltage regulating device and in particular to a voltage regulating device for an electric motor driving a cooling fan of a heat exchanger of a motor vehicle, such as, for example, the radiator of the engine cooling circuit.

More specifically, the invention relates to a voltage regulating device comprising: a support casing which is provided with a supply connector which is intended to be connected to a voltage source and an output connector which is intended to be connected to the electric motor; and control and regulation circuits of a programmable type which are carried by at least one circuit board or card which is mounted in the casing, the circuits comprising at least one programming terminal or pin.

BACKGROUND OF THE INVENTION

Voltage regulating devices of that type are known in which the support casing comprises a shell of molded plastics material, in which the supply and output connectors are integrally produced. There is connected to that shell, in a fluid-tight manner, a metal body which operationally acts as a heat dissipater and which is intended to dissipate the heat generated during operation by the control and regulation circuits. At least one programming terminal is provided inside the support casing. For access to the programming terminal in the voltage regulators according to the prior art, it is necessary to open the support casing which then has to be re-closed after the programming or reprogramming of the control and regulation circuits. Those operations are difficult, require time and are sometimes at risk of compromising the sealing of the support casing.

SUMMARY OF THE INVENTION

Hence there is a desire for a voltage regulating device of the type indicated above which is capable of overcoming the disadvantages of the solutions according to the prior art set out above.

This is achieved in the present invention by using a voltage regulating device of the type set out above, in which the above-mentioned programming terminal or pin extends in one of the connectors of the support casing and is accessible from outside the casing in the region of that connector.

Accordingly, in one aspect thereof, the present invention provides a voltage regulating device, for an electric motor driving a cooling fan of a heat exchanger of a motor vehicle, comprising: a support casing provided with a supply connector intended to be connected to a supply voltage source, and with an output connector intended to be connected to the motor; and control and regulation circuits of a programmable type, carried by at least one circuit board mounted in the casing, the circuits comprising at least one programming terminal, wherein the programming terminal extends in one of the connectors of the support casing and is accessible from outside the support casing.

Preferably, the programming terminal extends in the supply connector.

Preferably, the programming terminal extends in a receptacle which is provided in the corresponding connector of the support casing.

Preferably, the receptacle is closed and protected by a removable cover or cap.

BRIEF DESCRIPTION OF THE DRAWINGS

A preferred embodiment of the invention will now be described, by way of example only, with reference to figures of the accompanying drawings. In the figures, identical structures, elements or parts that appear in more than one figure are generally labeled with a same reference numeral in all the figures in which they appear. Dimensions of components and features shown in the figures are generally chosen for convenience and clarity of presentation and are not necessarily shown to scale. The figures are listed below.

FIG. 2 is a partially exploded, partial perspective view of the voltage regulating device of FIG. 1;

FIG. 2a is a perspective view which shows an embodiment of a programming terminal, being a part of the voltage regulating device of FIG. 2.

DETAILED DESCRIPTION OF THE PREFERRED EMBODIMENTS

Figure 1:
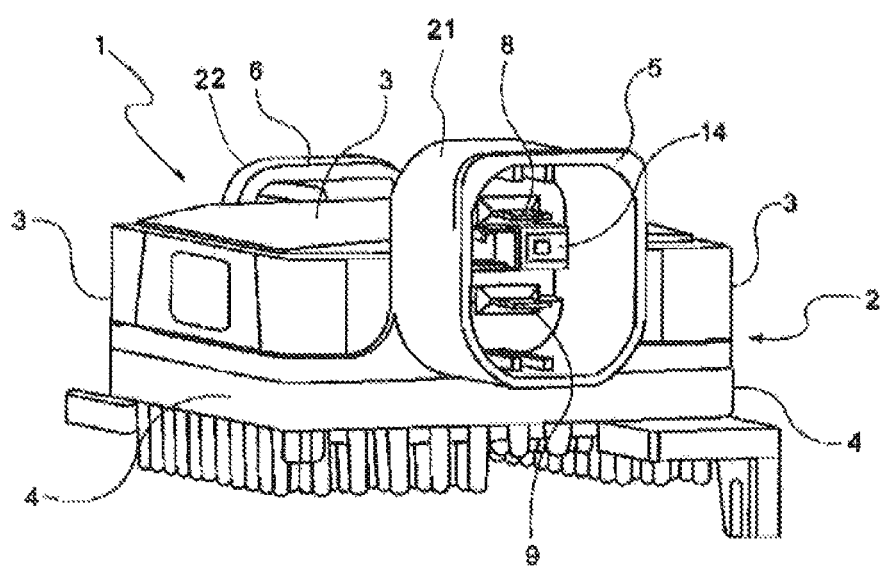
FIG. 1 is a perspective view of a voltage regulating device according to the present invention.

In the drawings, there is generally designated 1 a voltage regulating device according to a preferred embodiment of the present invention. The voltage regulating device is particularly intended to be connected to an electric motor which drives a cooling fan associated with a heat exchanger, for example a radiator, of a motor vehicle.

The voltage regulating device 1 comprises a support casing which is generally designated 2. In the exemplary construction illustrated, the casing 2 comprises a shell 3 of molded plastics material, to which there is connected in a fluid-tight manner a metal body 4 which operationally acts as a heat sink or thermal dissipater for dissipating the heat generated during operation.

A supply connector 5 which is intended to be connected to a direct-current supply voltage source and an output connector 6 (FIG. 1) which is intended to be connected to the controlled electric motor are integrally constructed in the shell 3. Preferably housing 21 and 22 of the supply connector and output connector are formed with the shell as a monolithic structure.

Figure 3:
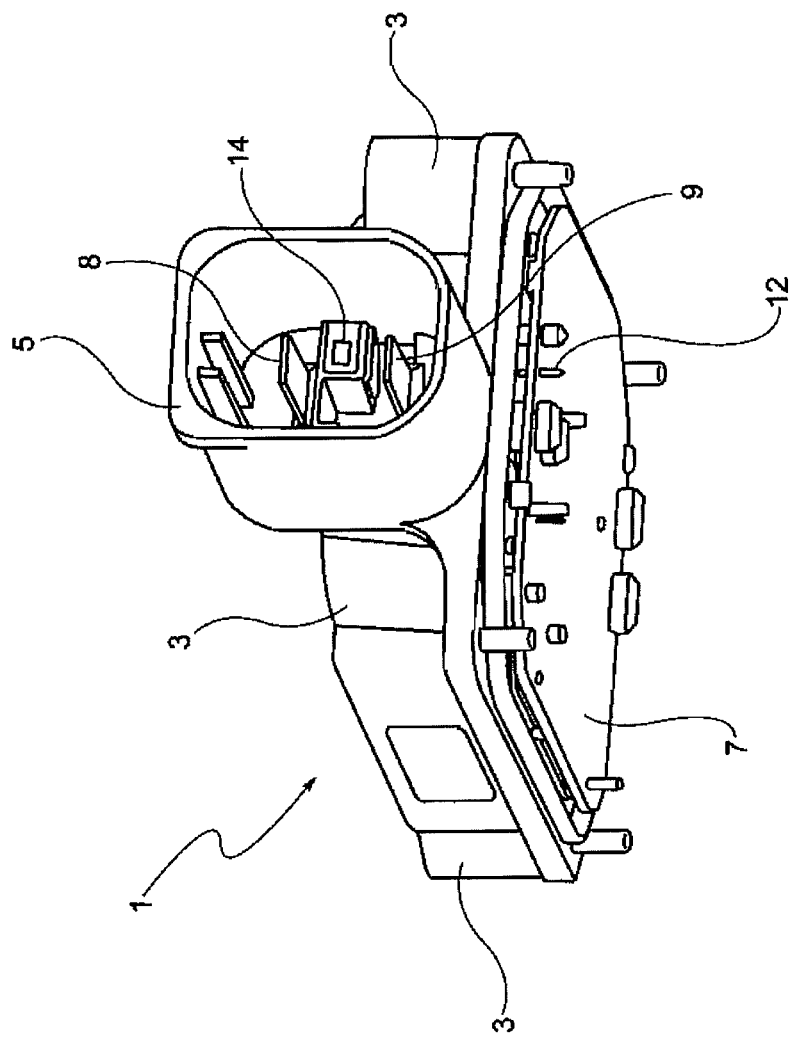
FIG. 3 is another partial perspective view of the voltage regulating device of FIGS. 1 and 2.
Figure 4:
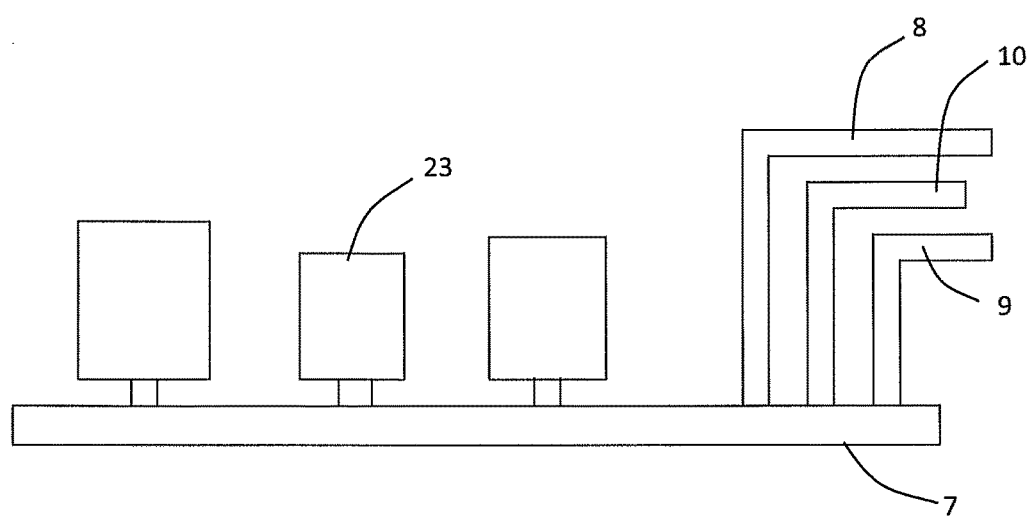
FIG. 4 is a schematic view illustrating the voltage regulating device of FIGS. 1 and 2 further depicting the control and regulation circuits on the circuit board.

With particular reference to FIGS. 3 and 4, control and regulation circuits 23 of the programmable type which are carried by a circuit board 7 are received in the support casing 2 and in particular in the shell 3. These circuits are connected to a pair of supply terminals 8 and 9 which extend in the supply connector 5, and to additional terminals which extend in the output connector 6 in a manner which is not illustrated. The circuits further comprise a programming terminal which is designated 10 in FIGS. 2 and 2a and which also extends in the supply connector 5 in such a manner as to be accessible from outside of the support casing in the region of the supply connector. The programming terminal 10 optionally is in the form of a pin.

In the exemplary embodiment of the drawings, the programming terminal 10 is represented by an end of an electrically conductive member 11, having another end 12 which is fixed to the circuit board 7, as can be seen in FIG. 3. In one example, a height of the end of the electrically conductive member 11 is less than a height of the receptacle 13 along an extending orientation of the electrically conductive member 11.

With reference to FIG. 2, the programming terminal 10 advantageously extends inside a receptacle 13 which is provided inside the connector 5 and to which there can be connected a protection and closure cover or cap 14 of the removable type. The receptacle 13 defines a space 131. The electrically conductive member 11 extends within the space 131. The receptacle 13 is closed and protected by receiving the cover or cap 14 into the space 131.

In the solution according to the present invention, the programming terminal of the circuits of the voltage regulating device is readily accessible from outside of the support casing 2 without compromising the fluid-tight seal of the support casing 2 of the voltage regulating device.

Although the invention is described with reference to one or more preferred embodiments, it should be appreciated by those skilled in the art that various modifications are possible. Therefore, the scope of the invention is to be determined by reference to the claims that follow.

In the description and claims of the present application, each of the verbs "comprise", "include", "contain" and "have", and variations thereof, are used in an inclusive sense, to specify the presence of the stated item but not to exclude the presence of additional items.

The invention claimed is:

1. A voltage regulating device, for an electric motor, comprising:
   a support casing provided with a supply connector intended to be connected to a supply voltage source, and with an output connector intended to be connected to the electric motor;
   control and regulation circuits of a programmable type, carried by at least one circuit board mounted in the casing, the circuits comprising at least one programming terminal for programming the control and regulation circuit;
   a receptacle disposed within the supply connector and only surrounding the at least one programming terminal; and
   a pair of supply terminals,
   wherein the programming terminal has a first end fixed to the board and a second end extending in the receptacle,
   wherein a cross sectional size of the second end is less than a cross sectional size of the supply terminal in the supply connector, the second end offsets from the supply terminal in the supply connector; and a height of the second end is less than a height of the supply terminal along an extending orientation of the second end, and
   wherein the receptacle is closed and protected by a cover or cap, the cover or cap closing only the receptacle, and the second end of the programming terminal is accessible from outside the support casing by removing the cover or cap covering the receptacle.

2. The voltage regulating device of claim 1, wherein the programming terminal is L-shaped.

3. A circuit assembly for an electric motor, comprising:
   a support casing provided with a connector having a housing and a plurality of terminals in the housing:
   a circuit board supported by the support casing and configured to be electrically coupled to the electric motor;
   a pair of supply terminals;
   control and regulation circuits of a programmable type, carried by at least one circuit board mounted in the casing;
   a programming terminal electrically coupled to the control and regulation circuits, extending in the housing of the connector and being accessible from outside the support casing; and
   a receptacle disposed inside the housing of the connector and only receiving the programming terminal;
   wherein the programming terminal has a first end fixed to the circuit board and a second end extending in the receptacle,
   wherein a cross sectional size of the second end is less than a cross sectional size of the supply terminal in the housing, the second end offsets from the supply terminal in the housing, and a height of the second end is less than a height of the supply terminal along an extending orientation of the second end, and
   wherein the receptacle is closed and protected by a cover or cap, the cover or cap closing only the receptacle, and the second end of the programming terminal is accessible from outside the support casing by removing the cover or cap covering the receptacle.

4. The circuit assembly of claim 3, wherein the support casing further comprises a shell which is integrally formed with the housing of the connector as a monolithic structure.

5. The circuit assembly of claim 3, further comprising a body connected to the support casing and the circuit board is arranged between the support casing and the body.

6. The circuit assembly of claim 5, wherein the body and the support casing are connected to each other in a fluid-tight manner.

7. The circuit assembly of claim 5, wherein the support casing is made of molded plastics and the body is made of metal.

8. The circuit assembly of claim 3, wherein the support casing further comprises a second connector, the circuit board being configured to be electrically coupled to the electric motor via one of the connector and the second connector, the other one of the connector and the second connector being configured to be connected to a supply voltage source.

* * * * *